United States Patent [19]

Suzuki

[11] Patent Number: 5,774,114
[45] Date of Patent: Jun. 30, 1998

[54] INPUT APPARATUS FOR CONTROLLING A DISPLAY DEVICE REMOTELY

[75] Inventor: Toshio Suzuki, Tokyo, Japan

[73] Assignee: Sony Corporation, Tokyo, Japan

[21] Appl. No.: 522,853

[22] Filed: Sep. 1, 1995

Related U.S. Application Data

[63] Continuation of Ser. No. 212,998, Mar. 15, 1994, abandoned.

[30] Foreign Application Priority Data

Mar. 17, 1993 [JP] Japan .................................. 5-082810

[51] Int. Cl.[6] .................................................. G09G 5/08
[52] U.S. Cl. ............................................ 345/157; 345/158
[58] Field of Search .................................. 345/156, 157, 345/158, 163, 164, 166, 169, 168, 159; 348/734; 273/148 B; 463/30, 31, 38, 39

[56] References Cited

U.S. PATENT DOCUMENTS

| | | | |
|---|---|---|---|
| 3,729,129 | 4/1973 | Fletcher et al. | 345/161 |
| 4,552,360 | 11/1985 | Bromley et al. | 345/159 |
| 4,594,586 | 6/1986 | Hosogoe | 345/164 |
| 4,754,268 | 6/1988 | Mori | 345/168 |
| 4,835,528 | 5/1989 | Flinchbaugh | 345/159 |
| 4,852,055 | 7/1989 | Lapeyre . | |
| 5,181,181 | 1/1993 | Glynn | 345/163 |
| 5,367,316 | 11/1994 | Ikezaki | 345/169 |

FOREIGN PATENT DOCUMENTS

| | | | |
|---|---|---|---|
| 0171747 | 2/1988 | European Pat. Off. . | |
| 0333839 | 12/1993 | Japan | 345/157 |
| 1006457 | 2/1963 | United Kingdom . | |
| 1475886 | 1/1974 | United Kingdom . | |
| 2205941 | 12/1988 | United Kingdom . | |
| 2255430 | 11/1992 | United Kingdom . | |

*Primary Examiner*—Chanh Nguyen
*Attorney, Agent, or Firm*—Jay H. Maioli

[57] ABSTRACT

An input apparatus for controlling a display device by using the screen display of the display device includes cursor moving unit for moving the position of a cursor on the screen of the display device, switching unit which is provided in conjunction with the cursor moving unit, and a controller for controlling at least the on/off operations of the input apparatus upon the display device. The switching unit switches on the power supply to the controller in accordance with a movement of the cursor moving unit.

5 Claims, 5 Drawing Sheets

Fig. 5

| VECTOR DIRECTION | VECTOR AMOUNT (VOLTAGE V) | | | |
|---|---|---|---|---|
| | 0~0.7 | 0.7~1.3 | 1.3~1.9 | 1.9~2.5 |
| A | 0 | 1 | 17 | 33 |
| B | 0 | 2 | 18 | 34 |
| C | 0 | 3 | 19 | 35 |
| D | 0 | 4 | 20 | 36 |
| E | 0 | 5 | 21 | 37 |
| F | 0 | 6 | 22 | 38 |
| G | 0 | 7 | 23 | 39 |
| H | 0 | 8 | 24 | 40 |
| I | 0 | 9 | 25 | 41 |
| J | 0 | 10 | 26 | 42 |
| K | 0 | 11 | 27 | 43 |
| L | 0 | 12 | 28 | 44 |
| M | 0 | 13 | 29 | 45 |
| N | 0 | 14 | 30 | 46 |
| O | 0 | 15 | 31 | 47 |
| P | 0 | 16 | 32 | 48 | great# INPUT APPARATUS FOR CONTROLLING A DISPLAY DEVICE REMOTELY

This is a continuation of application Ser. No. 08/212,998 filed Mar. 15, 1994, now abandoned.

BACKGROUND OF THE INVENTION

1. Field of the Invention

The present invention relates to an input apparatus such as a remote commander or the like which is preferable when it is used for a TV or a tape recorder and, more particularly, to an input apparatus in which a control signal is transmitted to a display device by moving an a directional input device.

2. Description of the Prior Art

In a TV, tape recorder, and the like, an input apparatus such as a remote commander or the like which can execute a remote control is used. In case of using the remote commander, for example, when a control signal is transmitted from the remote commander to the display device such as a CRT or the like, a cursor and an icon of a plurality of function keys are displayed on the screen of the display device. The cursor is moved onto a desired icon by the user and is decided by a decision key or the like, so that the function corresponding to the icon is executed. From the remote commander, a control signal for vertically or laterally moving the cursor, a control signal for executing the function corresponding to the icon, and the like are transmitted to the display device.

The remote commander having the following construction is known. For example, there is a remote commander having a construction in which a plurality of keys such as on/off key of a power source, menu key, decision key, volume control key, and the like are arranged. In the remote commander, when a desired key is pressed, a controller provided in the remote commander is activated and the code corresponding to the pressed key is generated. Infrared rays are modulated according to the code thus generated and irradiated onto the display device. After that, the operation of the remote commander is automatically stopped. In such a remote commander, when a predetermined key is pressed, the circuit is automatically activated.

There is also known a remote commander having a construction using, for example, a joystick volume as a directional input device. In this remote commander, when the joystick volume is moved, a voltage which is applied to a controller provided in the remote commander is changed. The voltage is sent to a display device. As such an input apparatus, for instance, an apparatus disclosed in Japanese Patent Application No. Hei 03-242454 is known.

On the other hand, in the remote commander in which a plurality keys are arranged, the user must operate many keys, so that a movement amount of fingers in the operation is inevitably large. Therefore, there is a difficulty in the operating efficiency.

In the remote commander using the joystick volume, the voltage which is supplied from an internal variable resistor to the controller is applied to an A/D conversion input terminal of the controller. Due to this, it is impossible to activate automatically the remote commander. In such a remote commander, there is used a method whereby a main body is activated by pressing a menu key or the like arranged independently, or a method whereby when the user grasps a remote commander, its state is detected and the remote commander is activated, or the like. However, in the above methods, since such a key or detecting circuit must be newly provided, it causes problems with respect to the points of the simplification of the operation, the miniaturization of the apparatus, and the like. Further, in case of stopping the remote commander, the key must be operated again. In the case where such an operation is not performed, battery of the remote commander is wasted.

OBJECTS AND SUMMARY OF THE INVENTION

It is, therefore, an object of the invention to provide an input apparatus in which the apparatus itself can be activated and stopped by a minimum construction and the waste of electric power consumption can be prevented.

According to an aspect of the invention, there is provided an input apparatus for controlling a display device by using the screen display of the display device comprising:

cursor moving means for moving the position of a cursor on the screen of the display device;

switching means which is provided in conjunction with the cursor moving means; and a controller for controlling at least the on/off operations of the input apparatus.

The above, and other, objects, features and advantage of the present invention will become readily apparent from the following detailed description thereof which is to be read in connection with the accompanying drawings.

BRIEF DESCRIPTION OF THE DRAWINGS

FIG. 5 is a code table of the control codes.

DETAILED DESCRIPTION OF THE PREFERRED EMBODIMENTS

An embodiment of the invention will be described hereinbelow with reference to the drawings.

Figure 1A:
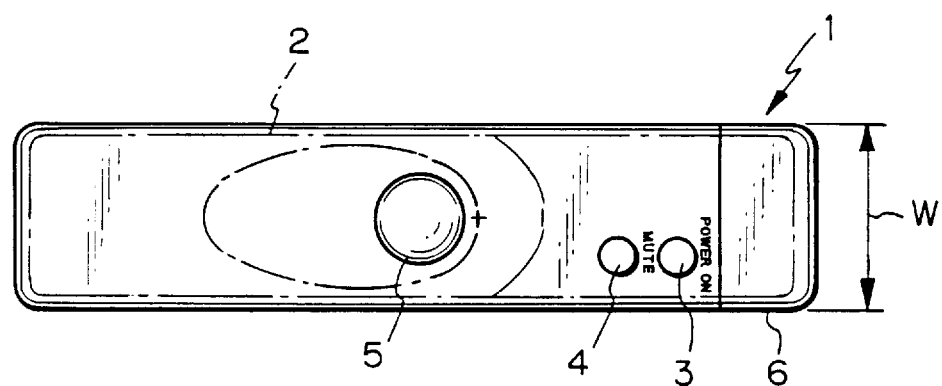
FIGS. 1A and 1B are top view, respectively, and side view of a remote commander.
Figure 1B:
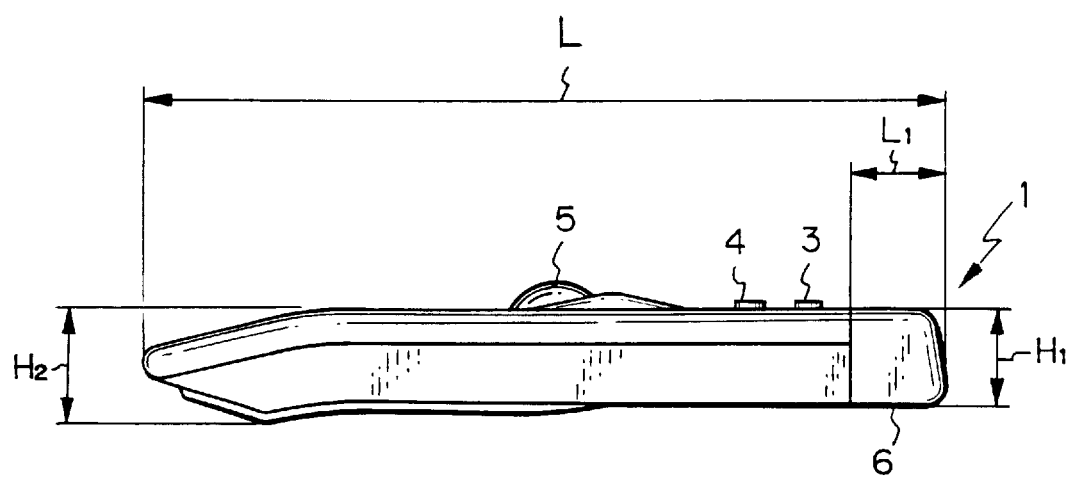

In FIGS. 1A and 1B, a top view and a side view in the case where an input apparatus according to the invention is embodied as a remote commander are shown. FIG. 1A is the top view of the remote commander. Referring to FIG. 1A, a power on/off key 3 to control the on/off operations of the power source and a mute key 4 to mute an audio sound are arranged in the front portion of an operating surface 2 of the remote commander 1. In almost the central portion of the operating surface 2, a directional input device (joystick or the like) 5 in which only one of the tip portions is projected to the outside is provided. The other tip portion of the directional input device 5 is axially supported in the remote commander 1. The tip portion of the operating surface 2 is a control signal output section 6 for transmitting a control code by infrared rays to a display device such as a TV.

FIG. 1B is the side view of the remote commander 1. As will be understood from FIG. 1B, the power on/off key 3, mute key 4, and directional input device 5 are constructed integrally with the remote commander 1 main body, so that the external view is not unsightly. With respect to the dimensions of the remote commander 1, for example, a size W in the lateral direction is set to 42 mm, a size L in the longitudinal direction is set to 184.7 mm, a length $L_1$ of the control signal output section 6 is set to 21.9 mm, a height $H_1$ is set to 21.6 mm, and a height $H_2$ is set to 27 mm.

Figure 2A:
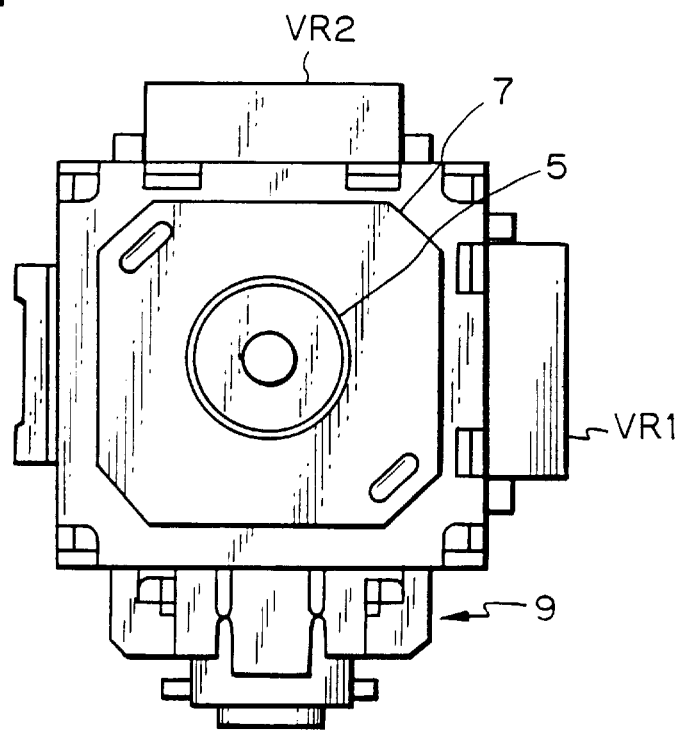
FIGS. 2A and 2B are perspective views, of a directional input device and its peripheral portions.
Figure 2B:
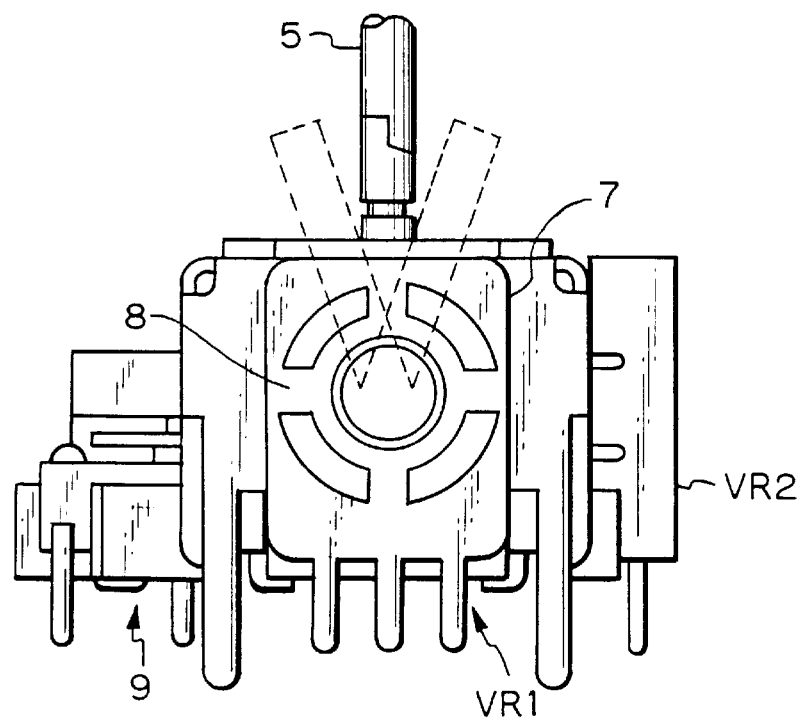

FIGS. 2A and 2B are perspective views of the directional input device 5 and its peripheral portions. In FIG. 2A, a perspective view from above the directional input device and its peripheral portions is shown. In FIG. 2B, a perspective view from the side directional input device and its peripheral portions is shown. Referring to FIG. 2A, another tip portion of the operator directional input device 5 is connected to an engaging portion 8 (not shown) of an almost square casing 7 in the remote commander 1. The directional input device 5 is rotatable around the other tip portion as an axis. A variable resistor VR1 is arranged on the first side of the casing 7, a variable resistor VR2 is arranged on the second side, and a switching circuit 9 is arranged on the third side facing the second side, respectively.

The switching circuit 9 is connected to a controller 11. For example, by depressing the directional input device 5 perpendicularly to the casing 7, the controller 11 is activated. Due to this, the remote commander is set into the operating state. Since the controller 11 can be activated by the directional input device 5 mentioned above, a key for activating the controller 11 is unnecessary. By depressing the directional input device 5, an icon is automatically displayed on the screen of the display device. Further, when the remote commander is not operated within a predetermined period of time, the controller is automatically turned off. Thus, it is prevented that an electric power is wasted.

Referring to FIG. 2B, the directional input device 5 can be inclined against the casing 7 by up to 80⁻ from a state in which the directional input device 5 is perpendicular to the casing (neutral state). Each of the variable resistors VR1 and VR2 is used to detect position information (comprising angle information indicative of a degree of inclination of the directional input device 5 and direction information) of the directional input device 5. Namely, on the casing 7, the variable resistor VR1 is used as a detector in the longitudinal direction of the directional input device 5, the variable resistor VR2 is used as a detector in the lateral direction of the directional input device 5, and the position information of the directional input device 5 can be detected.

Figure 3:
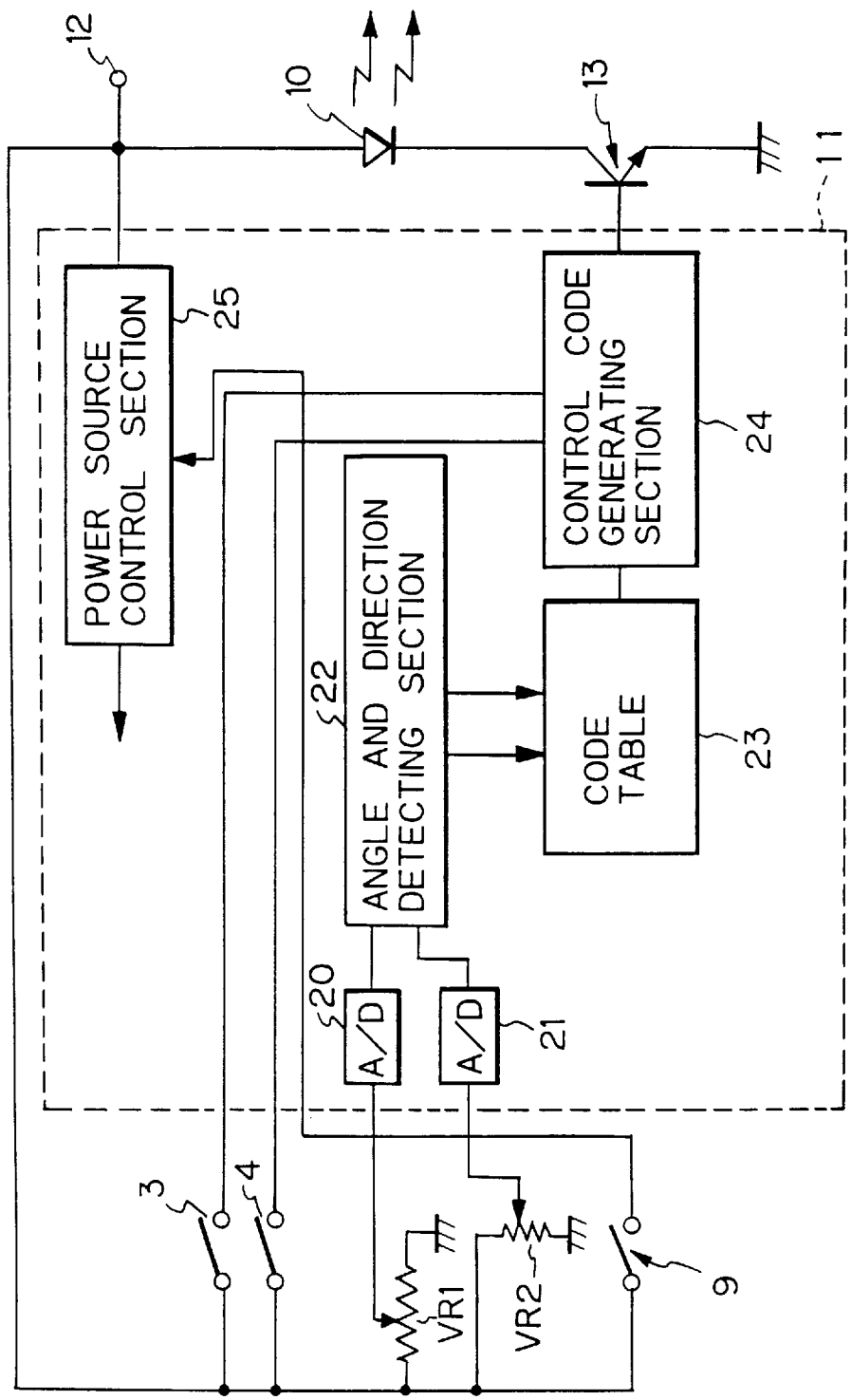
FIG. 3 is a circuit diagram of the remote commander.

In FIG. 3, a circuit diagram of the remote commander 1 mentioned above is shown. The circuit in FIG. 3 comprises a key input section (power on/off key 3 and mute key 4), the variable resistors VR1 and VR2, the switching circuit 9, and an LED 10 and a controller 11 for generating a control code for infrared rays. One end portion of the key input section, one end portion of the resistor of the variable resistor VR1, one end portion of the resistor of the variable resistor VR2, and one end portion of the switching circuit 9 are mutually connected. The other end portion of the key input section is connected to controller 11. The other end portion of the resistors of the variable resistors VR1 and VR2 are connected to the ground. The variable resistors VR1 and VR2 are connected to two A/D input terminals of the controller 11. In the case where the directional input device 5 is moved, resistance values of the variable resistors VR1 and VR2 are changed and the resultant values are supplied to the controller 11 as voltage values corresponding to new resistance values.

A power source voltage is supplied from a power source input terminal 12 to the controller 11. The anode side of the LED 10 is connected to the terminal 12. The cathode side of the LED 10 is connected to a collector of a transistor 13. A base of the transistor 13 is connected to controller 11 and an emitter is connected to the ground.

The controller 11 comprises: A/D converters 20 and 21 which are supplied with voltages from movable terminals of the variable resistors VR1 and VR2; an angle and direction detecting section 22 which is supplied with outputs of the A/D converters 20 and 21; a control code table 23; a control code generating section 24; and a power source control section 25 for supplying a power to each block of the controller which is controlled by the switch circuit 9. The angle and direction detecting section 22 detects the direction information and angle information of the directional input device 5 by the detection voltages of the variable resistors VR1 and VR2. The detected informations are converted into a predetermined control code by the control code table 23. The control code table 23 is constructed by a ROM memory, gate array, or the like. Each function of the angle and direction detecting section 22, control code table 23 and control code generating section 24 may be effected by a microcomputer.

When the circuit of the remote commander 1 shown in FIG. 3 operates, the switch circuit 9 is first turned on by depressing the directional input device Due to this, the controller 11 is activated and a control code indicative of displaying the icon of the function key on the screen of the display device is transmitted. Then, the icon of the function key is displayed on the screen of the display device. Subsequently, when the directional input device 5 is moved, the position information in the lateral direction is detected by the variable resistor VR1 and the position information in the longitudinal direction is detected by the variable resistor VR2, respectively. A voltage which is generated from each of the variable resistors VR1 and VR2 is supplied to the controller 11. The controller 11 selects a predetermined control code from the two supplied voltages. The transistor 13 is turned on simultaneously with the selection of the control code, thereby transmitting the selected control code from the LED 10 to the display device. The cursor on the screen of the display device is moved to a position according to the control code.

Figure 4:
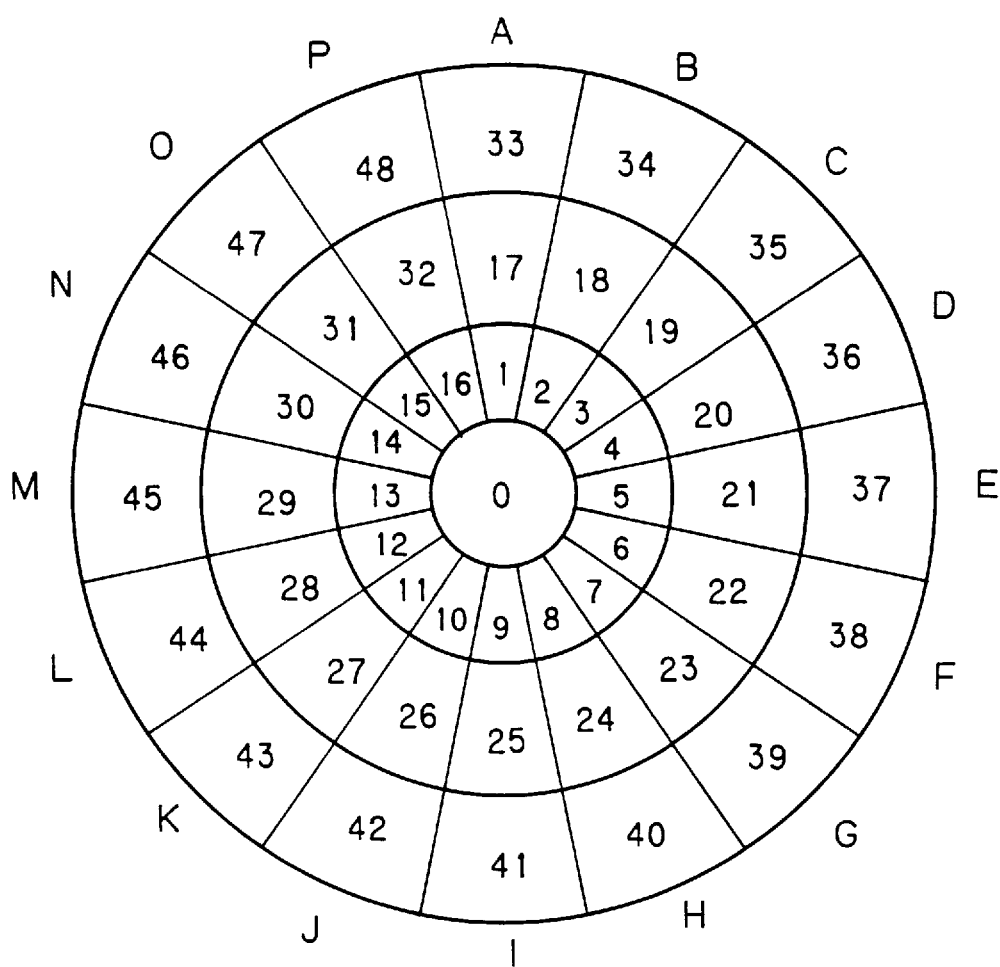
FIG. 4 is a schematic diagram showing a code definition of control codes.

In FIG. 4, in order to move the cursor on the screen of the display device, the code definition of the control code which is selected by the controller 11 is shown. According to the code definition shown in FIG. 4, the control codes of 0 to 48 are allocated and the vector directions of A to P are allocated. The control codes comprise levels of three stages. The first level is set to the control codes 1 to 16, the second level is set to the control codes 17 to 32, and the third level is set to the control codes 33 to 48. The control code 0 is used when the directional input device 5 exists at the position in the neutral state.

When the control code at the first level is generated, the moving speed of the cursor on the screen is set to a low speed. When the control code at the second level is generated, the moving speed is set to a middle speed, and when the control code at the third level is generated, the moving speed is set to a high speed, respectively. By variably changing the moving speed of the cursor on the basis of the control code level mentioned above, the cursor can be moved at a high speed in the case where the moving distance of the cursor is long and the cursor can be moved at a low speed when the moving distance of the cursor is short. A range of the vector direction of each level can be made different. Namely, by narrowing the ranges of the vector direction of the first and third levels and by widening the range of the vector direction of the second level, the directional input device 5 is moved to the innermost rim when setting to the first level, to the outermost rim when setting to the third level, and to a position other than the innermost and outermost rims when setting to the second level. Therefore, th e operating efficiency can be improved.

In order to detect to which one of the codes 1 to 48 the directional input device 5 was moved, the variable resistors VR1 and VR2 are used. That is, as mentioned above, the position information in the longitudinal direction of the directional input device 5 is detected by the variable resistor VR1, the position information in the lateral direction of the directional input device 5 is detected by the variable resistor VR2, respectively. An output voltage of each of the variable resistors VR1 and VR2 is supplied to the controller 11. In the controller 11, those output voltages are read and the codes according to the voltage value is generated.

In FIG. 5, a code table f or s electing the control code is shown. In the code table, two kinds of detection items regarding the directional input device 5 are provided. One of them is 'vector direction' (direction information) and the other is 'vector amount' (angle information). The code table is used in each of the longitudinal and lateral directions, separately.

When the directional input device 5 is in the neutral state, a voltage in a range of $0(V) \leq V < 0.7(V)$ is supplied to the controller 11. When the directional input device 5 is moved within a range of the first level (1 to 16), a voltage in a range of $0.7(V) \leq V < 1.3(V)$ is supplied to the controller 11.

When the directional input device 5 is moved within a range of the second level (17 to 32), a voltage in a range of $1.31(V) \leq V < 1.9 (V)$ is supplied to the controller 11. When the directional input device 5 is moved in a range of the third level (33 to 48), a voltage in a range of $1.9(V) \leq V < 2.5(V)$ is supplied to the controller 11. The range of each voltage mentioned above is an example and each voltage range can be varied.

The relation between the control code and the cursor on the screen will now be described hereinbelow by using the code table. For example, when the directional input device 5 is inclined in the vector direction C, the control code 5 can be set to any one of 3, 19, and 35. In this instance, in the case where the control code 3 is selected, the voltage in a range of $0.7(V) \leq V < 1.3(V)$ is supplied from the variable resistors VR1 and VR2 to the controller 11. Since the control code 3 belongs to the first level, the cursor is moved in the screen at a low speed. Similarly, in the case where the control code 19 is selected, a voltage in a range of $1.3(V) \leq V < 1.9(V)$, or in the case where the control code 35 is selected, a voltage in a range of $1.9(V) \leq V < 2.5(V)$ is supplied from the variable resistors VR1 and VR2 to the controller 11, respectively. Since the control code 19 belongs to the second level, the cursor is moved in the screen at a middle speed. Since the control code 35 belongs to the third level, the cursor is moved in the screen at a high speed.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

According to the invention, since the remote commander can be activated by depressing the operator, it is unnecessary to provide a circuit for detecting that the directional input device grasps a key for activation or the remote commander. Therefore, the movement amount of fingers can be reduced and the circuit can be miniaturized. In the case where the directional input device is not operated in a predetermined period of time, since the remote commander is automatically turned off, it is possible to prevent that an electric power is wasted consumed.

What is claimed is:

1. An input apparatus for controlling a display device by using a screen display of the display device, comprising:
    an operating surface;
    a wireless transmitter;
    cursor moving means for moving a position of a cursor on the screen display of the display device, said cursor moving means having directional input means protruding from said operating surface of said input apparatus and operated by a user for indicating a desired movement of said position of said cursor on the screen display of the display device by a corresponding movement of said directional input means;
    a controller for controlling operation of said input apparatus including:
        an angle and direction detecting circuit responsive to movement of said directional input means,
        memory means for storing a control code table and for receiving an output from said angle and direction and detecting circuit for conversion thereof to a corresponding control code from a plurality of control codes arranged in three levels in said control code table based on an angle of inclination and direction of movement of said directional input means relative to said operating surface, said three levels including a first level whereby a moving speed of said cursor on the screen is set to a low speed, a second level whereby said moving speed of said cursor on the screen is set to a middle speed, and a third level whereby said moving speed of said cursor on the screen is set to a high speed,
        a control code generating circuit for generating a signal representative of the control code output from said control code table, said signal being fed to said wireless transmitter for transmission to the display device, and
        a power supply for supplying power to said controller; and
    switching means coupled with said directional input means of said cursor moving means for switching on said power supply of said controller in accordance with a movement of said directional input means in a predetermined direction relative to said operating surface of said input apparatus.

2. The input apparatus according to claim 1, wherein said controller generates a control code for displaying an icon on the screen of the display device when said power supply of said controller is switched on.

3. The input apparatus according to claim 1, wherein said controller is automatically turned off when said directional input means of said cursor moving means is not operated within a predetermined period of time.

4. The input apparatus according to claim 1, wherein said predetermined direction is perpendicular to said operating surface, and wherein said cursor moving means further includes:
    first variable resistor means for performing detection in a longitudinal direction of movement of said directional input means; and
    second variable resistor means for performing detection in a lateral direction of movement of said directional input means.

5. The input apparatus according to claim 4, wherein said controller further includes:
    first and second A/D converters supplied with respective outputs of said first and second variable resistor means, and wherein respective outputs of said first and second A/D converters are fed to said angle and direction detecting circuit.

* * * * *